US010868497B2

(12) United States Patent
Wang et al.

(10) Patent No.: US 10,868,497 B2
(45) Date of Patent: Dec. 15, 2020

(54) UNBALANCED TERAHERTZ FREQUENCY DOUBLER CIRCUIT WITH POWER HANDLING CAPACITY

(71) Applicant: THE 13TH RESEARCH INSTITUTE OF CHINA ELECTRONICS TECHNOLOGY GROUP CORPORATION, Hebei (CN)

(72) Inventors: Junlong Wang, Hebei (CN); Zhihong Feng, Hebei (CN); Dabao Yang, Hebei (CN); Shixiong Liang, Hebei (CN); Lisen Zhang, Hebei (CN); Xiangyang Zhao, Hebei (CN); Dong Xing, Hebei (CN); Peng Xu, Hebei (CN)

(73) Assignee: THE 13TH RESEARCH INSTITUTE OF CHINA ELECTRONICS TECHNOLOGY GROUP CORPORATION, Hebei (CN)

( * ) Notice: Subject to any disclaimer, the term of this patent is extended or adjusted under 35 U.S.C. 154(b) by 138 days.

(21) Appl. No.: 16/321,480

(22) PCT Filed: Aug. 28, 2017

(86) PCT No.: PCT/CN2017/099274
§ 371 (c)(1),
(2) Date: Jan. 29, 2019

(87) PCT Pub. No.: WO2018/019311
PCT Pub. Date: Feb. 1, 2018

(65) Prior Publication Data
US 2020/0280283 A1    Sep. 3, 2020

(30) Foreign Application Priority Data

Jul. 29, 2016   (CN) .......................... 2016 1 0608507

(51) Int. Cl.
*H03B 19/14*   (2006.01)
*H01P 5/107*   (2006.01)

(52) U.S. Cl.
CPC ............. *H03B 19/14* (2013.01); *H01P 5/107* (2013.01)

(58) Field of Classification Search
CPC ........... H03B 19/14; H01P 5/107; H01P 5/10
See application file for complete search history.

(56) References Cited

U.S. PATENT DOCUMENTS 8,693,973 B2 *   4/2014   Chattopadhyay ........ H03D 7/02
455/325

FOREIGN PATENT DOCUMENTS

CN    104935254 A    9/2015
CN    104967409 A    10/2015
(Continued)

OTHER PUBLICATIONS

Alain Maestrini et al., A 540-640-GHz High-Efficiency Four-Anode Frequency Tripler, IEEE Transactions on Microwave Theory and Techniques, Sep. 30, 2005, pp. 2835-2843, vol. 53, No. 9.
(Continued)

*Primary Examiner* — Jung Kim
(74) *Attorney, Agent, or Firm* — Slater Matsil, LLP

(57) ABSTRACT

An unbalanced terahertz frequency doubler circuit with power handling capacity is provided, and the circuit includes a RF input waveguide, a quartz substrate and a RF output waveguide, where one end of the quartz substrate is disposed in a waveguide groove of the RF input waveguide and the other end of the quartz substrate is disposed in a waveguide groove of the RF output waveguide, where an input transition microstrip is disposed on the quartz substrate, and one end of the transition microstrip is connected to an output transition microstrip sequentially through a first transmis-
(Continued)

sion microstrip, a low pass filter, a RF matching microstrip and a second transmission microstrip, where anodes of four GaAs-based terahertz frequency multiplier diode groups are connected to the RF matching microstrip, and a cathode at the outermost position of each of the GaAs-based terahertz frequency multiplier diode groups is connected to a grounding quartz strip.

9 Claims, 1 Drawing Sheet

(56) References Cited

FOREIGN PATENT DOCUMENTS

| CN | 104993795 A | 10/2015 |
|----|-------------|---------|
| CN | 205883165 U | 1/2017  |

OTHER PUBLICATIONS

International Search Report of PCT Patent Application No. PCT/CN2017/099274 dated Nov. 17, 2017.

* cited by examiner

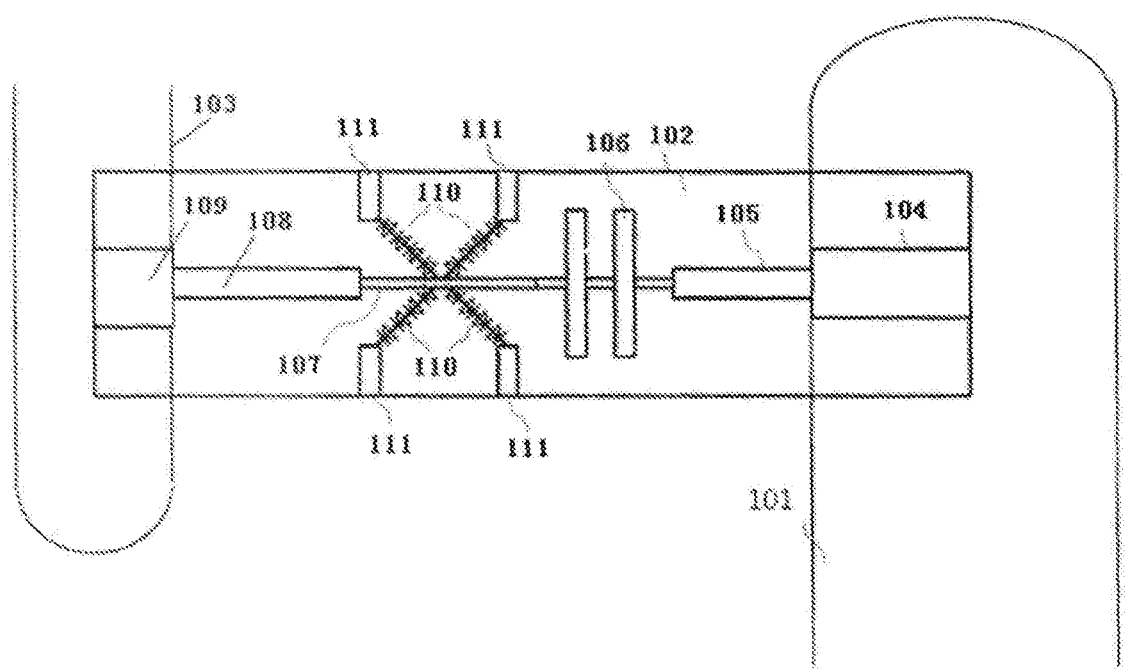

UNBALANCED TERAHERTZ FREQUENCY DOUBLER CIRCUIT WITH POWER HANDLING CAPACITY

TECHNICAL FIELD

The present application relates to the field of terahertz circuit technology, and particularly to an unbalanced terahertz frequency doubler circuit with power handling capacity.

BACKGROUND

In a broad sense, a terahertz (THz) wave refers to an electromagnetic wave having a frequency in the range of 0.1-10 THz, where 1 THz=1000 GHz, and some people think that a terahertz frequency refers to an electromagnetic wave in the range of 0.3 THz-3 THz. Terahertz waves occupy a very special position in the electromagnetic spectrum. Terahertz technology is recognized as a very important cross-cutting frontier in the international scientific and technological community.

In systems such as terahertz communication, terahertz measurement and the like, the source is critical. At present, the miniaturized and low-cost solid-state terahertz frequency doubling technology is a hot issue in the international research, which mainly uses a GaAs base plane Schottky diode as a nonlinear frequency doubling device for realizing the power output of the Terahertz band. Extending the Terahertz frequency source based on solid-state electronic technologies is an effective way. In the development of circuit technologies, the secondary frequency doubling technology has been widely developed due to its high frequency doubling efficiency.

After 2000, technologies regarding solid-state frequency doubling develop much rapidly, which mainly include balanced circuit structure and unbalanced circuit structure. Both circuits can increase the power carrying capacity by increasing the number of Schottky diodes. Due to that the two ends of the Schottky diode directly contact the cavity wall, the unbalanced circuit has better heat dissipation effect and can carry more input power compared with the balanced circuit, thus the unbalanced circuit is being adopted gradually.

In the unbalanced secondary frequency doubling circuit that is often used nowadays, Schottky diodes are generally fabricated into diodes suitable for the secondary frequency doubling circuit during the manufacturing process, which generally only have four junctions or six junctions, and the effective power of each junction of the Schottky diodes is around 20 mW, thereby limiting the input power to further increase, and causing the output power unable to increase continually. Moreover, large power output has a broader application prospect, therefore a new form of frequency doubling circuit needs to be developed.

Technical Problem

The technical problem to be solved by the present application is to provide a high power capacity THz-scale frequency doubling unbalanced circuit, which has simple structure and can withstand greater input power due to the increasing number of schottky diodes.

SUMMARY

In order to solve the above technical problem, the technical solutions adopted by the present application provide an unbalanced terahertz frequency doubler circuit with power handling capacity, which includes a RF input waveguide, a quartz substrate and a RF output waveguide, where one end of the quartz substrate is disposed in a waveguide groove of the RF input waveguide and the other end of the quartz substrate is disposed in a waveguide groove of the RF output waveguide, where an input transition microstrip is disposed on the quartz substrate, and one end of the transition microstrip is connected to an output transition microstrip sequentially through a first transmission microstrip, a low pass filter, a RF matching microstrip and a second transmission microstrip, where anodes of four GaAs-based terahertz frequency multiplier diode groups are connected to the RF matching microstrip, and a cathode at the outermost position of each of the GaAs-based terahertz frequency multiplier diode groups is connected to a grounding quartz strip, where each of the GaAs-based terahertz frequency multiplier diode groups includes four Schottky diodes connected in series.

Preferably, the input transition microstrip is an input transition microstrip with an E-plane probe.

Preferably, the low pass filter is a 5th order or 7th order high-low impedance microstrip.

Preferably, two ends of each of the GaAs-based terahertz frequency multiplier diode groups are respectively connected to the RF matching microstrip and the grounding quartz strip through conductive pastes.

Preferably, the grounding quartz strip is grounded through a conductive paste and a housing.

Preferably, the thickness of the quartz substrate ranges from 30 μm to 75 μm.

Preferably, the RF input waveguide is a WM-2032 rectangular waveguide, and a and b of the rectangular waveguide are respectively 2032 μm and 1016 μm.

Preferably, the four GaAs-based terahertz frequency multiplier diode groups are fixed on the quartz substrate in a form of oblique cross.

The technical effect of adopting the above technical solutions lies in that: the structure of the unbalanced circuit is simple; as the number of schottky diodes used increases, they can withstand greater input power; four GaAs-based terahertz frequency multiplier diode groups are arranged in an oblique cross shape, which can achieve better grounding.

BRIEF DESCRIPTION OF DRAWINGS

FIG. 1 is a structural schematic diagram of the circuit according to an embodiment of the present application; where: 101-radio frequency (RF) input waveguide, 102-quartz substrate, 103-RF output waveguide, 104-input transition microstrip, 105-first transmission microstrip, 106-low pass filter, 107-RF matching microstrip, 108-second transmission microstrip, 109-output transition microstrip, 110-GaAs-based terahertz frequency multiplier diode group, and 111-grounding quartz strip.

DETAILED DESCRIPTION

The technical solutions in the embodiments of the present application are clearly and completely described in the following with reference to the drawings in the embodiments of the present application. It is obvious that the described embodiments are only a part of the embodiments of the present application, and not all of the embodiments. All other embodiments obtained by those skilled in the art based on the embodiments of the present application without creative efforts are within the scope of the present application.

In the following description, numerous specific details are set forth in order to provide a full understanding of the present application, but the present application may be implemented in other ways than those described herein, and those skilled in the art can make similar promotion without departing from the scope of the application, thus the present application is not limited by the specific embodiments disclosed below.

As shown in FIG. 1, an embodiment of the present application discloses an unbalanced terahertz frequency doubler circuit with power handling capacity, which includes a RF input waveguide 101, a quartz substrate 102 and a RF output waveguide 103, where one end of the quartz substrate 102 is disposed in a waveguide groove of the RF input waveguide 101, and the other end of the quartz substrate 102 is disposed in a waveguide groove of the RF output waveguide 103, where RF signals are input through the RF input waveguide 101, and frequency-doubled signals are output through the RF output waveguide.

An input transition microstrip 104 is disposed on the quartz substrate 102, where one end of the transition microstrip 104 is connected to an output transition microstrip 109 sequentially through a first transmission microstrip 105, a low pass filter 106, a RF matching microstrip 107 and a second transmission microstrip 108. It should be noted that the first transmission microstrip 105, the low pass filter 106, the RF matching microstrip 107, the second transmission microstrip 108 and the output transition microstrip 109 are also disposed on the quartz substrate 102. The input transition microstrip 104 as a whole is disposed on the quartz substrate above the waveguide groove of the RF input waveguide 101, and the output transition microstrip 109 as a whole is disposed on the quartz substrate above the waveguide groove of the RF output waveguide 103.

The anodes of the four GaAs-based terahertz frequency multiplier diode groups 110 are connected to the RF matching microstrip 107, and the cathode, at the outermost position of each of the GaAs-based terahertz frequency multiplier diode groups 110, is connected to one grounding quartz strip 111, where each of the GaAs-based terahertz frequency multiplier diode groups 110 includes four Schottky diodes connected in series.

In order to better illustrate the present application, a specific embodiment of the present application will be described by taking an example of 100 GHz as an input frequency and 200 GHz as an output frequency.

The RF input waveguide 101 (here, the RF input waveguide is a WM-2032 rectangular waveguide, and a and b are respectively 2032 µm and 1016 µm) introduces a 100 GHz RF signal, and the input transition microstrip 104 on the quartz substrate introduces the RF signal from the input waveguide to the circuitry on the quartz substrate for transmission, where the thickness of the quartz substrate is typically 30 to 75 µm. The low pass filter 106 can be a 5th order or 7th order high-low impedance microstrip. The function of the low pass filter is configured to transmit the input RF signal to the diode at the maximum, while prevent the second harmonic (200 GHz) of the RF signal from feeding back to the input end. The role of the RF matching microstrip is configured to match impedance between the impedance of the input RF signal with the impedance of the diodes, such that the RF signal is fed into the GaAs-based terahertz frequency multiplier diode groups 110 to the greatest extent. The GaAs-based terahertz frequency multiplier diode groups 110 are connected in parallel with each other in the same direction with respect to the RF input signal, and are connected in parallel with each other in the same direction with respect to RF output terminals. During use, each anode of the GaAs-based terahertz frequency multiplier diode groups 110 is connected to the RF matching microstrip 107, and each cathode of the GaAs-based terahertz frequency multiplier diode groups 110 is connected to the grounding quartz strip 111. Two ends of each of the GaAs-based terahertz frequency multiplier diode groups 110 are respectively connected to the RF matching microstrip 107 and the grounding quartz strip 111 through a conductive paste. The grounding quartz strip 111 is well grounded by the conductive paste and the cavity. A flip soldering process is employed in the manufacture of the GaAs-based terahertz frequency multiplier diode groups 110.

The structure of the unbalanced circuit is simple; as the number of schottky diodes used increases, they can withstand greater input power; four GaAs-based terahertz frequency multiplier diode groups are arranged in an oblique cross shape, which can achieve better grounding.

The invention claimed is:

1. An unbalanced terahertz frequency doubler circuit with power handling capacity, comprising a RF input waveguide (101), a quartz substrate (102) and a RF output waveguide (103), wherein one end of the quartz substrate (102) is disposed in a waveguide groove of the RF input waveguide (101) and the other end of the quartz substrate (102) is disposed in a waveguide groove of the RF output waveguide (103), wherein an input transition microstrip (104) is disposed on the quartz substrate (102), and one end of the transition microstrip (104) is connected to an output transition microstrip (109) sequentially through a first transmission microstrip (105), a low pass filter (106), a RF matching microstrip (107) and a second transmission microstrip (108), wherein anodes of four GaAs-based terahertz frequency multiplier diode groups (110) are connected to the RF matching microstrip (107), and a cathode at the outermost position of each of the GaAs-based terahertz frequency multiplier diode groups (110) is connected to a grounding quartz strip (111), wherein each of the GaAs-based terahertz frequency multiplier diode groups (110) comprises four Schottky diodes in series connection.

2. The circuit of claim 1, wherein the input transition microstrip (103) is an input transition microstrip with an E-plane probe.

3. The circuit of claim 1, wherein the low pass filter (106) is a 5th order high-low-impedance microstrip.

4. The circuit of claim 1, wherein two ends of each of the GaAs-based terahertz frequency multiplier diode groups (110) are respectively connected to the RF matching microstrip (107) and the grounding quartz strip (111) through conductive pastes.

5. The circuit of claim 1, wherein the grounding quartz strip (111) is grounded through a conductive paste and a housing.

6. The circuit of claim 1, wherein the thickness of the quartz substrate (102) ranges from 30 µm to 75 µm.

7. The circuit of claim 1, wherein the RF input waveguide (101) is a WM-2032 rectangular waveguide, and a length and a width of the rectangular waveguide are respectively 2032 µm and 1016 µm.

8. The circuit of claim 1, wherein the four GaAs-based terahertz frequency multiplier diode groups (110) are fixed on the quartz substrate in a form of oblique cross.

9. The circuit of claim 1, wherein the low pass filter (106) is a 7th order high-low-impedance microstrip.

* * * * *